(12) United States Patent
Walker et al.

(10) Patent No.: US 8,278,684 B1
(45) Date of Patent: Oct. 2, 2012

(54) VOLTAGE PROTECTION DEVICE

(75) Inventors: Andrew J. Walker, Mountain View, CA (US); Helmut Puchner, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 838 days.

(21) Appl. No.: 11/954,514

(22) Filed: Dec. 12, 2007

(51) Int. Cl.
*H01L 29/66* (2006.01)

(52) U.S. Cl. .................. 257/173; 257/355; 257/E29.181

(58) Field of Classification Search .................. 257/355, 257/173
See application file for complete search history.

(56) References Cited

U.S. PATENT DOCUMENTS

| | | | | |
|---|---|---|---|---|
| 5,455,436 A * | 10/1995 | Cheng | ........................... | 257/356 |
| 5,576,557 A * | 11/1996 | Ker et al. | ........................ | 257/173 |
| 5,754,380 A * | 5/1998 | Ker et al. | ........................ | 361/56 |
| 5,962,902 A * | 10/1999 | Kato et al. | ..................... | 257/372 |
| 6,323,523 B1 * | 11/2001 | Lee et al. | ........................ | 257/355 |
| 6,414,360 B1 * | 7/2002 | Gardner | ........................ | 257/369 |
| 6,614,078 B2 * | 9/2003 | Lee et al. | ...................... | 257/372 |
| 6,919,603 B2 * | 7/2005 | Brodsky et al. | ................ | 257/361 |
| 6,933,540 B2 * | 8/2005 | Liu et al. | ......................... | 257/173 |
| 2003/0016479 A1 * | 1/2003 | Song | .................................. | 361/56 |
| 2004/0075146 A1 * | 4/2004 | Yu | ..................................... | 257/362 |
| 2004/0217425 A1 * | 11/2004 | Brodsky et al. | ................ | 257/360 |
| 2004/0227215 A1 * | 11/2004 | Spenea et al. | ................. | 257/665 |
| 2006/0220137 A1 * | 10/2006 | Kuroda et al. | ................. | 257/361 |
| 2007/0114565 A1 * | 5/2007 | Makaram | ....................... | 257/133 |

* cited by examiner

*Primary Examiner* — Benjamin Sandvik

(57) ABSTRACT

A voltage protection device and method is provided to prevent accidental triggering of an silicon-controlled rectifier (SCR) unless the electrostatic discharge (ESD) is at a predefined threshold above the normal power supply operating voltage or below the ground supply operating voltage. The holding voltage upon the SCR is maintained above the threshold voltage to prevent accidental triggering. The present SCR avoids use of an additional field effect transistor (FET), and avoids relying upon the breakdown of the drain terminal of the FET, but instead programs the amount of holding voltage needed above the power supply voltage using mask-programmability, fuses, or other means for maintaining the holding voltage to a desired range above the power supply voltage. The programmed holding voltage is implemented using a barrier region between the PNP and the NPN of the PNPN junctions of the SCR. In addition to or as an alternative to the barrier region, hole sink junctions can be implemented close to the anode to reduce the substrate resistance in the vicinity of the anode and, therefore, extract holes from their normal target destination.

8 Claims, 3 Drawing Sheets

VOLTAGE PROTECTION DEVICE

BACKGROUND OF THE INVENTION

1. Field of the Invention

The present invention relates generally to an electrostatic discharge (ESD) protection apparatus and method, and more particularly, to a smaller and more efficient protection device embodying a semiconductor-controlled or silicon-controlled rectifier (SCR) with a programmable holding voltage.

2. Description of the Related Art

The following descriptions and examples are given as background information only.

As is well-known in the microelectronics industry, integrated circuit devices are susceptible to damage from application of excessive voltages, such as electrostatic discharge (ESD) events. During an ESD event, charge transferred within a circuit can develop voltages that are large enough to breakdown insulating films, such as gate oxides, on the device. Alternatively, the charge can dissipate significant energy to cause electro-thermal failures in the device itself.

An ESD event can arise from handling a packaged integrated circuit, where charge is transferred from the external environment to an input/output (I/O) pad of the integrated circuit. The charge transfer can occur in a time typically less than 1 microsecond, which is sufficient time to breakdown the insulating films, or contacts, of transistors coupled to the I/O pad. Another type of ESD event involves "hot socket insertion." For example, the integrated circuit may be used in a mixed-voltage environment, where the integrated circuit may operate at one voltage level, but must interface with another integrated circuit operating at a different, possibly higher voltage level. The dissimilar supply voltage levels cause charge to be applied on the I/O pad whenever the integrated circuit is inserted into a board or chipset having a higher supply voltage. In addition to impeding charge from the environment or via hot socket insertion, there are many other well-known examples of ESD events, all of which apply voltage exceeding, by many orders of magnitude, the normal (or nominal) supply voltage of the integrated circuit. Any such ESD event which is intermittent and more than maybe 20-50% of the normal operating parameters of the integrated circuit can be classified as "excessive voltage" arising from an ESD event.

There are numerous ways in which to protect the integrated circuit when an ESD event occurs. For example, a clamp can be used to shunt the incoming voltage on the I/O pad within a desired window that is tolerable to the integrated circuit. A popular clamping device can include a diode between the I/O pad and the power and supply conductors. When an ESD event occurs, the positive or negative polarity ESD voltage will be shunted to the positive or negative power and ground supplies, respectively. Unfortunately, however, this causes undue fluctuation on the power and/or ground supply conductors, which then measurably impacts the operation and reliability of all circuits connected thereto.

Another approach that can be used is to apply a silicon-controlled rectifier or semiconductor-controlled rectifier (SCR) circuit between the I/O pad and a ground supply conductor for shunting away positive or negative polarity ESD voltages. While progress has been made in the development of SCR-based circuits, fast ESD events, such as those described in Charged Device Model (CDM), have uncovered weaknesses in at least some of the known SCR-based ESD protection circuits. Moreover, many SCR circuits require a field-effect transistor (FET) for controlling the SCR. When the ESD event occurs, the junction formed by the drain of the FET and its corresponding substrate breaks down under high reverse bias voltage, thereby causing the first of a pair of transistors within the SCR to turn on. The addition of a third FET above and beyond the feedback-coupled pair of transistors of the SCR increases the overall footprint or geometric size of the protection device. As geometries continue to shrink and the area demands on the integrated circuit increase, requiring a third transistor proves not only inefficient, but unreliable when depending on a consistent breakdown of that transistor for triggering forward conduction of the SCR.

Accordingly, there is a need to provide an improved ESD protection circuit suitable not only for use in the integrated circuit, but also one that has minimum footprint, is more accurate as to its holding voltage, and yet maintains tighter control of the power and ground supply voltages applied to the power and ground conductors during an ESD event and after the event subsides.

SUMMARY OF THE INVENTION

The problems outlined above are in large part addressed by an improved apparatus and method hereof. The apparatus is one that can protect an integrated circuit and, more particularly, protect the integrated circuit against all types of ESD events. The protection device can include an SCR and, specifically, an SCR that is absent a controlling field-effect transistor (FET). More specifically, the protection device involves a pair of transistors coupled so that each receives base current from the collector terminal of the other. The emitter terminals of the transistor pair are coupled to the power and ground supply conductors, respectively. The SCR protects against excessive voltages placed on the power and ground supply conductors. Absent the use of a third transistor, the present protection device enjoys a smaller layout dimension along the substantially planar substrate topology. In addition, the holding voltage maintained on the gate terminal of the SCR is more tightly controlled through a diode-connection of the power supply voltage to the gate. The connection can be programmed either to exist or not. For example, a mask can be used, similar to a read-only memory (ROM) mask, for either making the contact between the power supply conductor and the diode or not. Alternatively, a fuse can exist at the contact location and, if blown, the power supply is disconnected from the diode. Still further, a transistor can be used and the base or gate of the transistor controls whether the power supply is connected or not. Of course, there can be multiple other mechanisms in which to programmably apply a power supply voltage through a diode junction to the gate in order to maintain the SCR's holding voltage.

According to one example, the holding voltage is preferably above the power supply voltage. The holding voltage can be 10%, 15%, 20%, or possibly 25% greater than the power supply voltage. The amount by which the holding voltage exceeds the power supply voltage depends on the environment in which the integrated circuit is placed. For example, if the integrated circuit is to be "hot socket" inserted, then it may be necessary that the holding voltage be at or above the higher voltage in which the integrated circuit encounters when inserted into a board or chipset operating at the higher power supply voltage. For example, if the integrated circuit operates at 3.3 volts, it may be necessary that the holding voltage exceed 5.0 volts if the integrated circuit is to be inserted and operate with another integrated circuit operating at 5.0 volts.

By maintaining the holding voltage above the power supply voltage, the forward-conducting state of the SCR will be ensured of dissipating whenever the ESD event goes away.

For example, if the holding voltage is maintained less than the power supply voltage, any inadvertent rise in the power supply during operation will trigger the SCR into a forward-conducting state, thereby possibly causing a catastrophic failure since the power supply is essentially shorted to the ground supply. By placing the holding voltage above the power supply voltage, it is less likely that the SCR will be accidentally triggered when, for example, spurious noise is applied to the power supply conductor.

One mechanism in which to ensure a higher holding voltage is to implement a barrier structure within the integrated circuit. The barrier structure can receive a voltage through various program means. When applied to a diode junction, that voltage serves to partially block the flow of holes and electrons between the PNPN junctions of the SCR device.

As set forth herein, a p-type region refers to a first conductivity type, and a n-type region refers to a second conductivity type. A p-type region refers to the impurities formed through p-type dopants. An n-type region refers to the impurities used to dope the n-type regions. Accordingly, the voltage protection device comprises a first region of a first conductivity type within a second region of a second conductivity type. A fourth region of the second conductivity type is within a third region of the first conductivity type. The second region is also within the third region. A fifth region of the second conductivity type interchangeably referred to as a barrier region or barrier structure is within the third region, and is spaced between the second region and the fourth region. The fifth region is programmably coupled to a power supply conductor, for example. According to a further example, the device includes at least one sixth region of the first conductivity type. The sixth region is placed within the third region, and spaced between the fifth region and the fourth region. The sixth region can be programmably coupled to a ground supply conductor. The sixth region is interchangeably referred to as a hole-drain region or ground supply connection region.

According to yet another embodiment, the voltage protection device comprises an SCR circuit embodied upon and/or within an integrated circuit, along with a power supply conductor and a ground supply conductor. The SCR can include a gate terminal as well as an anode and cathode pair of terminals. The anode and cathode terminals are coupled between a power supply conductor and a ground supply conductor, respectively. A programmable contact can be configured between the power supply conductor and a PN junction-coupled gate terminal of the SCR. A holding voltage on the gate terminal is maintained above the voltage upon the power supply conductor even after the voltage upon the power supply conductor is reduced below a trigger bias voltage. The trigger bias voltage is derived from, for example, a trigger circuit that maintains the trigger bias voltage below the voltage associated with an ESD event.

Yet further, a method is provided. The method is one which reduces voltage upon a power supply conductor that triggers a flow of holes from the power supply conductor to a ground supply conductor upon receiving an ESD voltage. Conversely, a flow of electrons are triggered from the ground supply conductor to the power supply conductor. By programmably applying a voltage upon a barrier structure, the flow of holes and electrons are partially blocked, thereby increasing the hold voltage on the gate terminal of the SCR.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
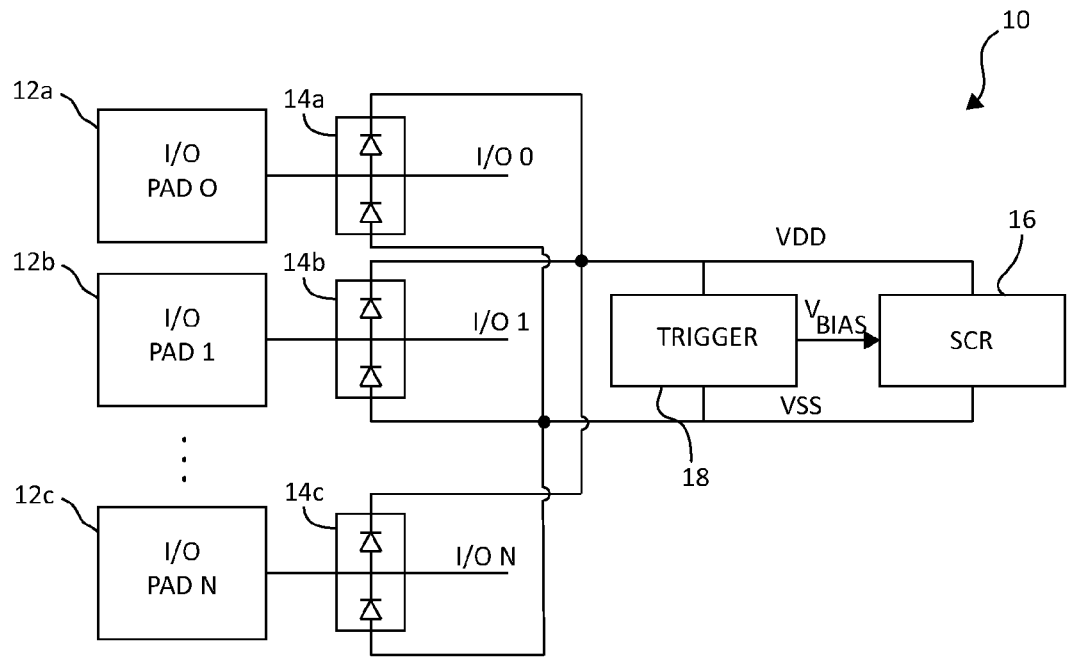
FIG. 1 is a block diagram and circuit schematic of a protection device capable of being triggered upon receiving an ESD event upon the power supply conductor of an integrated circuit, according to one example.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, like reference numerals are used to identify identical components in the various figures. Beginning with FIG. 1, a device 10 is shown for protecting against ESD events. Particularly, device 10 is used to protect an integrated circuit from excessive voltages placed on, for example, an I/O pad or possibly multiple I/O pads 12a, 12b, 12c, etc. Each pad can be connected to, for example, an output buffer or an input buffer, or various other circuitry items. Protection device 10 can be embodied upon the same monolithic substrate which contains various other circuits, including the I/O pads 12. Device 10 includes, for example, a power supply bus or conductor containing a power supply voltage ($V_{DD}$), as well as a ground supply bus or conductor containing a ground supply voltage ($V_{SS}$).

According to one example, the input/output arising from each respective pad 12 can be placed into respective clamping circuits 14a, 14b, 14c, etc. Each clamping circuit 14 can include a first diode coupled between the pad conductor and the power supply conductor ($V_{DD}$), as well a second diode coupled between the pad conductor and the ground supply conductor ($V_{SS}$). The anodes of the first of each pair of diodes are connected to the input pad, while the cathodes are connected to the power supply conductor. The second of each pair of diodes has an anode connected to the ground supply conductor, while its cathode is connected to the input pad. The first diode of each pair is used for shunting positive polarity ESD voltages onto the power supply conductor, while the second diode of each pair is used for shunting negative polarity ESD voltages onto the ground supply conductor.

As an ESD voltage occurs, significant voltage amplitude exceeding by at least 10-20% the nominal power supply is applied to the power supply for each positive polarity ESD event. Likewise, for each negative polarity ESD event, significant negative voltage at least 10-20% lower than the ground supply voltage can occur. While significant positive and negative ESD voltages can be shunted onto the power and ground supply conductors, the spiking on those conductors will negatively impact circuit operation of each circuit coupled to those conductors throughout the integrated circuit. In other words, the power and ground supply conductors ($V_{DD}$ and $V_{SS}$, respectively) shown in FIG. 1 are routed throughout the integrated circuit, and are used to supply power and ground to numerous other circuits embodied on the same monolithic substrate as device 10. The voltage spikes on the power and ground supply conductors not only can breakdown gate oxides, but also can cause electro-thermal failure in other portions of the integrated circuit.

To protect the excess voltages on the power and ground supply conductors, SCR 16 can be coupled as a clamping circuit between the power and ground supply conductors. Whenever an ESD voltage is encountered, SCR 16 will shunt that current either from the power supply conductor to the ground or vice-versa, and clamp the voltage. Beneficially, SCR 16 is configured so that substantially no leakage current exists between power and ground supplies during normal operation (i.e., when the ESD event is not present, or has terminated). Normal operation is hereby defined as times in which the power supply voltage deviates less than possibly 20%, and in some instances less than 10%, of the specified amount. The same can be said for the ground supply conductor, with normal operation being that which the ground supply conductor deviates no more than 20% or 10% less than 0 volts. For example, if the normal voltage on the power supply conductor is 5 volts, then normal operation would be possibly 5.5 volts or 6.0 volts, depending on whether the tolerated specification can be 10% or 20%. However, if an ESD event occurs in which the ESD voltage exceeds 20% and, more particularly, more than several times the normal $V_{DD}$=5 volts, for example, then the circuit is said to be in the ESD protection mode—not normal mode. A trigger circuit 18 can be used to set a bias voltage input to the SCR 16. The bias voltage is any voltage which is less than the normally encountered ESD voltage. For example, if $V_{DD}$ voltage equals 5.0 volts, and normal operation can extend upward to 6.0 volts, then the $V_{BIAS}$ can be set at possible 10-20% above 6.0 volts. Thus, whenever an ESD voltage occurs exceeding 10-20% above 6.0 volts, SCR 16 is triggered. The $V_{BIAS}$ can also be set at a voltage exceeding (in the negative) 10-20% below 0 volts, causing SCR 16 to trigger, whenever, for example, a negative polarity ESD event exceeding −0.6 volts (10%) or −1.2 volts (20%) in negative voltage magnitude.

Figure 2:
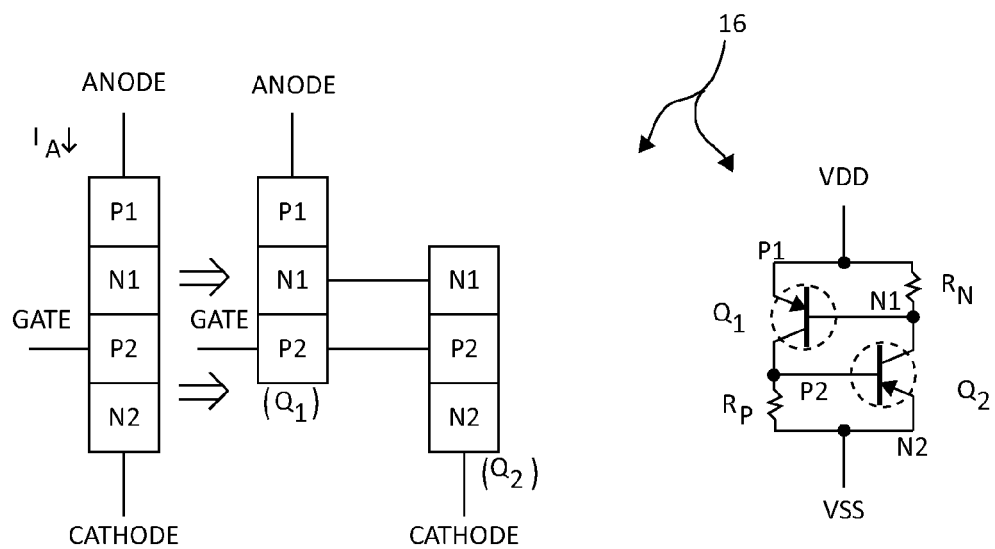
FIG. 2 is an exemplary, perspective view and corresponding circuit schematic of the SCR of FIG. 1.

The circuit schematic shown in FIG. 2 illustrates SCR 16 made up of two transistors, each transistor Q1 and Q2 can be a bipolar junction transistor. Transistor Q1 is a PNP bipolar junction transistor, and transistor Q2 is an NPN bipolar junction transistor. Each transistor receives base current from the collector terminal of the other transistor. Thus, when either transistor is turned on, it supplies base current to the other. Therefore, SCR 16 latches up with both transistors Q1 and Q2 after either of the transistors is initially turned on. The two transistors Q1 and Q2 turn off when the current is interrupted in either transistor.

SCR 16 can be used in connection with, for example, SRAM circuits having an operating voltage of $V_{DD}$=3.3 volts and must withstand applications of 5.0 volts (nominal) on certain input pads when hot-socket inserted. Alternatively, SCR 16 can operate at $V_{DD}$=5.0 volts and must withstand ESD events that exceed, for example, 6.5 volts or higher.

The first region is preferably designated as a P+ region, the second region is preferably designated as an N− region, the third region is preferably designated as a P− region, and the fourth region is preferably designated as an N+ region. A P− region is typically doped approximately $2.5 \times 10^{14}$ cm$^{-3}$; whereas a P+ region is typically doped much heavier at approximately $1.0 \times 10^{20}$ cm$^{-3}$. An N− region can be doped approximately $2.0 \times 10^{17}$ cm$^{-3}$; whereas an N+ region can be doped approximately $1.5 \times 10^{20}$ cm$^{-3}$.

Figure 3:
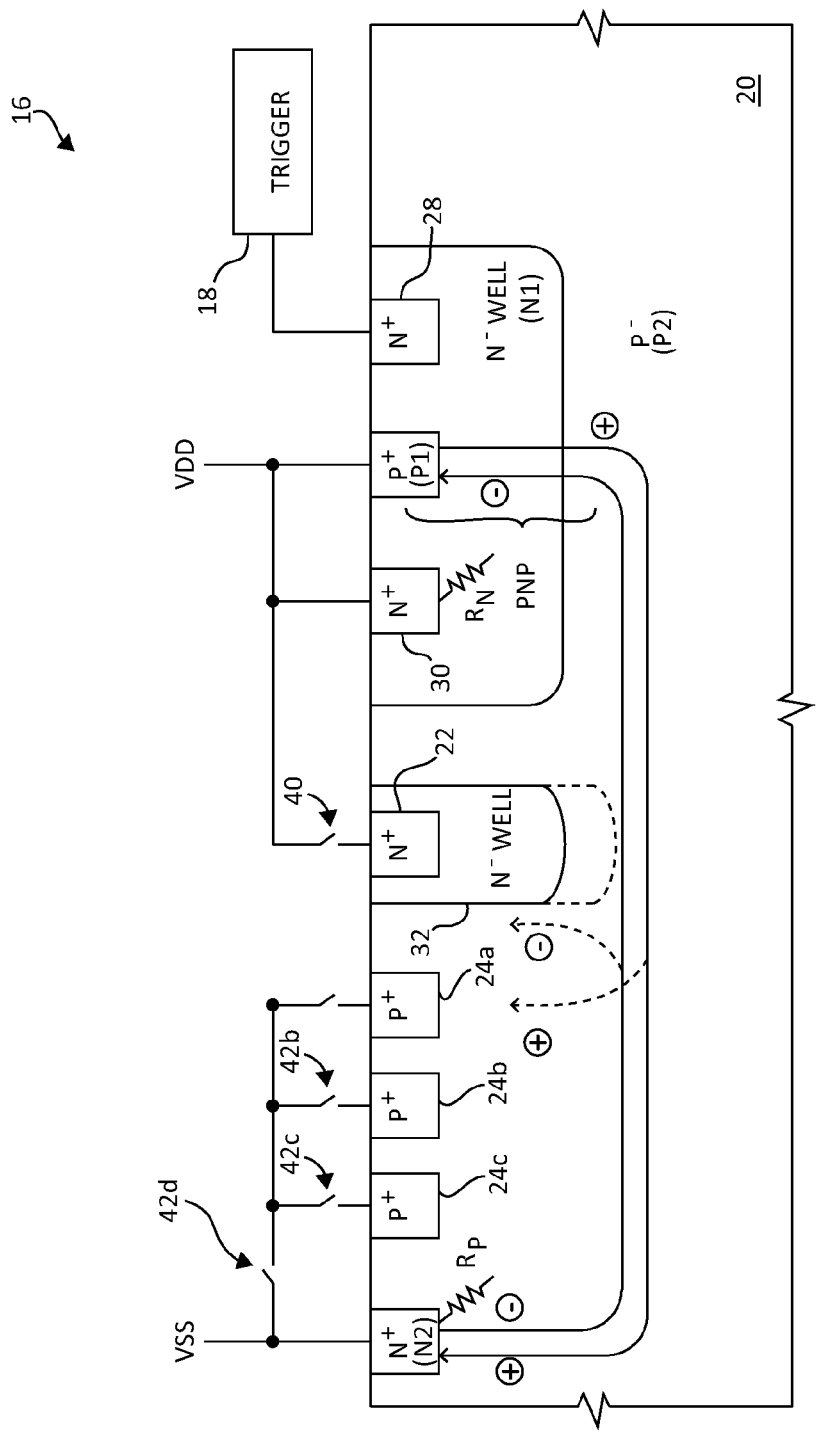
FIG. 3 is a simplified, exaggerated, partial cross-sectional view of an integrated circuit having the SCR of FIGS. 1 and 2 with programmably connected electron and hole barrier/sink structures placed upon and into the integrated circuit, according to one exemplary embodiment.

FIG. 3 is a partial cross-sectional view of an integrated circuit. More specifically, FIG. 3 illustrates the portion of an integrated containing SCR 16. Although shown separate from SCR 16, trigger circuit 18 can be embodied upon and within a substrate 20 of the integrated circuit. Trigger circuit 18 is only shown separate so as not to detract from the cross-sectional view of SCR 16, yet it is recognized that trigger circuit 18 can be included with the integrated circuit which bears SCR 16. The first, second, third, and fourth regions P1, N1, P2, and N2, respectively, are designated at their appropriate locations, yet exaggerated and simplified for brevity in the drawings. In addition to the first, second, third, and fourth regions, a fifth region 22 and at least one sixth region 24a, 24b, 24c, etc. are shown. Fifth region 22 is doped at approximately the same concentration as the fourth region N2. Moreover, the sixth region is preferably doped at approximately the same concentration as the first region P1. As will be described below, fifth region 22 is placed within an N− well having similar dopant concentration as the N− well which forms the second region. Moreover, further description will be provided as to the programmable connection of a power supply voltage ($V_{DD}$) to fifth region 22, as well as the programmable connection of a ground supply voltage ($V_{SS}$) to at least one sixth region 24.

When an ESD event occurs, the power supply voltage ($V_{DD}$) rises. Specifically, the amount of rise will be greater than the $V_{BIAS}$ voltage sent from trigger circuit 18 onto N+ region 28. The rising voltage on the first region P1 will cause a forward bias and current to flow within the second region N1 and, in doing so, forming a resistance ($R_N$) between the first and second regions. As current flows through the second region N1, beneath first region P1 from the N+ tap 30 to the N+ trigger voltage terminal 28, the junction between the first and second regions forward biases. Therefore, holes are injected from the first region into the second region across the PN junction.

A vertical PNP occurs from the anode connection on the first region to the third region P2. As holes are injected through the vertical PNP junction, the holes (designated as a circled +) drift from the third region onto the fourth region N2, where they are collected. By placing the ground supply taps closer to the fourth region by virtue of regions 24, the drifting holes will be picked up by the P+ regions 24. Preferably, the P+ region 24c placed closest to the fourth region will pick up the most current and, therefore, the most holes. The P+ regions 24 help keep holes from accumulating on the fourth region N2, and lessen the amount of forward bias on the fourth region. As the forward bias increases, however, the fourth region N2 will inject electrons (designated by a circled −). By placing the P+ tap 24 as close to the fourth region as possible, the amount of forward bias will be decreased, and the P− substrate resistance will also be decreased in the location of the fourth region. As will be described below, regions 24 can be programmably coupled and, when coupled, can increase the holding voltage in the third region P2.

As the electrons from the fourth region are injected into the third region P2, they will be picked up by the second region N1, which is essentially connected to $V_{DD}$ through region 30.

Thus, the electrons are accumulated on region 30 and swept to the power supply, while holes are accumulated on the P+ region 24 and swept to the ground supply. The drifting of holes and electrons between a pair of terminals connected to the power supply and ground supply perpetuate the formation of the PNPN junction and, therefore, the forward-conducting state of SCR 16.

To increase the amount of work needed to keep the SCR in a forward-conducting state, it would be desirable to minimize the perpetuation of the holes and electrons exchange mechanism. One way in which to do so is to insert a wall or barrier 32 in the hole and electron travel path. As electrons are injected from the fourth region N2 along the third region P2, barrier 32 absorbs some of those electrons as shown by dashed line 34. Likewise, if holes are traversing region P2, sixth regions 24 will extract some of those holes, as shown by dashed line 36. Lessening the amount of holes which arrive onto fourth region N2 and electrons that arrive onto first region P1 effectively increases the holding voltage of the SCR. It becomes more difficult for the SCR to continue to sustain itself in the forward-conducting state (low impedance state). More current is needed to flow between region 30 and region 28 in order to maintain the forward-conducting state. This requires a higher power supply voltage upon region 30 in order to generate the current. Depending on the amount of barrier needed, region 32 can be doped with either more concentration or deeper than the second region N1 if desired. This, however, would require a separate masking step to generate region 32 independent of region N1. However, in most instances, region 32 is doped at the same concentration and the doping/implant is performed at the depth as region N1. Therefore, a separate mask and masking step is not needed.

Figure 4:
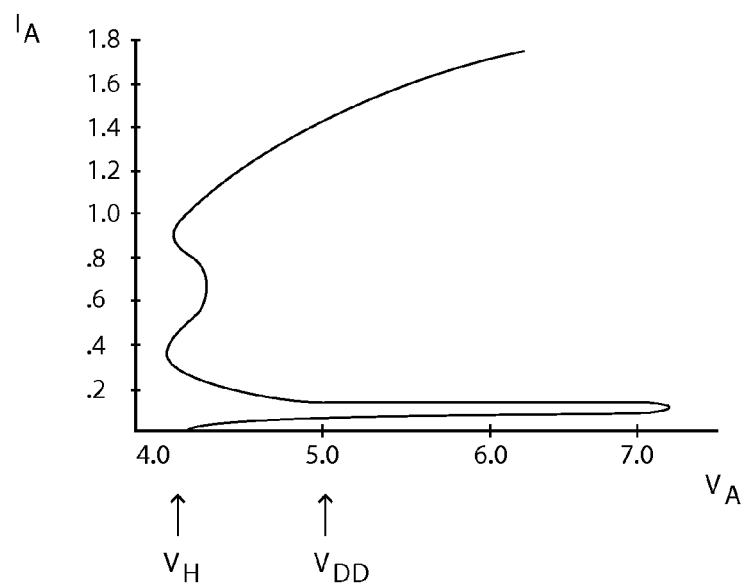
FIG. 4 is graph of current through and voltage across the exemplary SCR of FIGS. 1-3 absent the electron barrier/sink structure connected to $V_{DD}$, showing a holding voltage ($V_H$) less than $V_{DD}$.

Referring to FIG. 4, experimental data of SCR 16 absent a barrier region 32 is performed and shown. At concentrations described above and at a power supply voltage of approximately 5.0 volts, a holding voltage ($V_H$) of approximately 4.2 volts was discovered.

Figure 5:
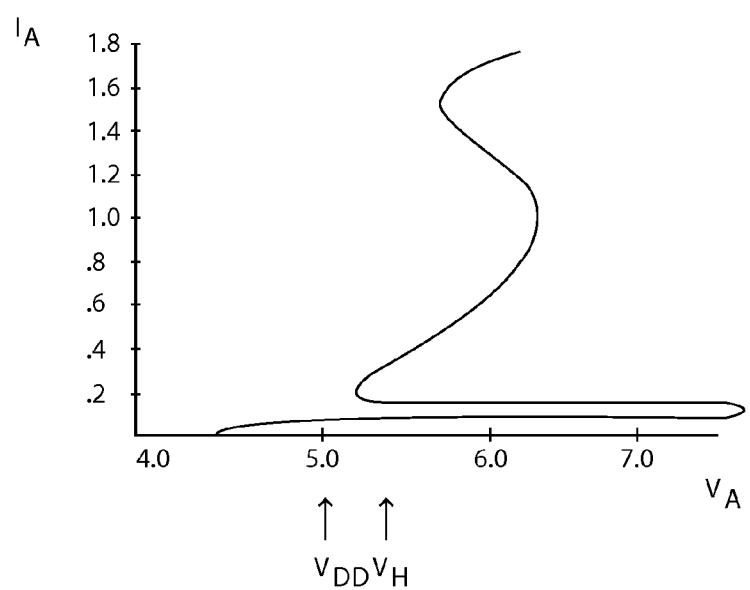
FIG. 5 is a graph of current through and voltage across the exemplary SCR of FIGS. 1-3 with the electron barrier/sink structure connected to $V_{DD}$, showing a holding voltage ($V_H$) greater than $V_{DD}$.

Referring to FIGS. 3 and 5 in combination, experimental results indicate that by adding a barrier region 32, the holding voltage ($V_H$) can be increased above the power supply voltage ($V_{DD}$), with the power supply voltage simulated at 5.0 volts. The barrier region mitigates some of the cross flow of holes and electrons within region P2, and forces a larger current flow between regions 30 and 28 caused by placing greater voltage imputed through an ESD event onto the power supply voltage ($V_{DD}$). That voltage or the holding voltage must be considerably higher than the power supply voltage of 5.0 volts. Thus, whenever an ESD event imputes voltage onto the power supply conductor exceeding the normal power supply voltage, that amount of imputed voltage must surpass a predetermined threshold before the SCR 16 is activated or triggered. The amount of holding voltage that exceeds the power supply voltage must be approximately 10% according to one embodiment, or approximately 20% according to another embodiment.

SCR 16 utilized in an ESD clamp can preferably be constructed using 0.13 micron technology, with a mask-programmable holding voltage. The programmable holding voltage occurs using mask-programmable connections, contacts, or general purpose switches or fuses 40 placed between the power supply and fifth region 22 (FIG. 3). Further mask programmability, fuses, switches, etc. 42a-42d can be used to connect the ground supply to various hole sink junctions 24a-24c (FIG. 3). If mask-programmable, the mask can be one which is applied later in the processing sequence, such as metal mask or contact mask, for example.

The addition of programmability provides flexibility to the overall design depending on the desired holding voltage threshold required. Utilizing an FET and the breakdown on the drain region of an FET is not programmable, and adds to the overall size of the SCR. The present SCR ESD clamp not only protects the fragile deep-submicron CMOS transistors, but also is very stable for fairly large power supply protection. By keeping the holding voltage above the supply voltage, temporary glitches applied to the power supply will not trigger the SCR unless those glitches are fairly large in magnitude, preferably greater than 10% or 20% above the normal power supply voltage. Moreover, the present solution offers fast ESD, an efficient SCR footprint, and is compatible with CDM requirements when triggered. Accidental triggering which might cause catastrophic failure is minimized by maintaining a stable holding voltage above the normal power supply voltage. It may be desirable only to implement programmable connection to the barrier region 32 or to regions 24, but not both, depending on the amount of holding voltage above the normal power supply voltage needed.

It will be appreciated to those skilled in the art having the benefit of this disclosure that this invention is believed to provide a device and method for protecting ESD appearing on input, output, or input/output pads of an integrated circuit. The device is considerably smaller in dimension within the plane of the semiconductor topography than other ESD devices that require, for example, an additional transistor for controlling the SCR. Moreover, the present SCR is assured to maintaining $V_H$ greater than $V_{DD}$ since the barrier wall is connected to $V_{DD}$ and modulates the flow of electrons back to the vertical PNPN device that sources holes. Further modifications and alternative embodiments of various aspects of the invention will be apparent to those skilled in the art in view of this description. For example, although the devices are specifically discussed in reference to protection from ESD events, the devices may additionally or alternatively be used to protect against other excessive voltage events, or any event which places excess voltage upon the power supply conductor and thereafter is removed. Once removed, however, and the present ESD device is ensured of entering a blocking state and does not enter a forward conducting state until the excess voltage exceeds $V_{DD}$. It is intended that any such protection device that achieves the aforesaid purpose is subsumed herein, and the following claims are to be interpreted to embrace all such modifications and changes and, accordingly, the drawings and the specification are to be regarded in an illustrative rather than a restrictive sense.

What is claimed is:

1. A voltage protection device, comprising:
   a pnp transistor and an npn transistor configured as a semiconductor controlled rectifier, comprising:
   a first region emitter of a first conductivity type within a second region base of a second conductivity type;
   a fourth region emitter of the second conductivity type within a third region base of the first conductivity type, wherein the second region base is within the third region base; and
   a barrier region of the second conductivity type is within the third region base and spaced between the second region base and the fourth region emitter, and wherein the barrier region extends into the third region base by a depth at least the same as a depth of the second region base, said barrier region functionally effective to at least partially block electron and hole flow in the third region base between the first region and the fourth region.

2. The device as recited in claim 1, including a fifth region of the second conductivity type located within and having a higher dopant concentration than the barrier region, the fifth region spaced from side and bottom boundaries of the barrier region, a programmable connection between the fifth region and a first power supply conductor, and wherein the second region is coupled to the first power supply conductor.

3. The device as recited in claim 2, wherein the first region emitter is coupled to the first power supply conductor, and the fourth region emitter is coupled to a ground supply conductor.

4. The device as recited in claim 1, further comprising at least one sixth region of the first conductivity type disposed in the third region between the barrier region and the fourth region emitter, the at least one sixth region having a higher dopant concentration than the third region base and coupled to a second supply potential conductor.

5. The device as recited in claim 4, further comprises a fuse to programmably couple the fifth region to the first power supply conductor, and another fuse to programmably couple the sixth region to a ground supply conductor.

6. The device as recited in claim 4, wherein the barrier region and the at least one sixth region are configured to impede flow of electrons and holes between the first region emitter and the fourth region emitter.

7. The device as recited in claim 1, wherein the first conductivity type comprises p-type dopants, and wherein the second conductivity type comprises n-type dopants.

8. The device as recited in claim 1, wherein the barrier region is a well region that extends a greater depth within the third region than the second region base.

* * * * *